(12) United States Patent
Fukui

(10) Patent No.: US 10,578,960 B2
(45) Date of Patent: Mar. 3, 2020

(54) MASK BLANK WITH RESIST FILM AND METHOD FOR MANUFACTURING THE SAME AND METHOD FOR MANUFACTURING TRANSFER MASK

(71) Applicant: HOYA CORPORATION, Tokyo (JP)

(72) Inventor: Toru Fukui, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 0 days.

(21) Appl. No.: 15/327,519

(22) PCT Filed: Jul. 27, 2015

(86) PCT No.: PCT/JP2015/071195
§ 371 (c)(1),
(2) Date: Jan. 19, 2017

(87) PCT Pub. No.: WO2016/024474
PCT Pub. Date: Feb. 18, 2016

(65) Prior Publication Data
US 2017/0168382 A1    Jun. 15, 2017

(30) Foreign Application Priority Data
Aug. 13, 2014    (JP) .................. 2014-164855

(51) Int. Cl.
*G03F 1/20*      (2012.01)
*G03F 7/11*      (2006.01)
*G03F 7/095*     (2006.01)
*G03F 7/32*      (2006.01)
*G03F 1/00*      (2012.01)
(Continued)

(52) U.S. Cl.
CPC .................. *G03F 1/20* (2013.01); *G03F 1/00* (2013.01); *G03F 7/0045* (2013.01); *G03F 7/0046* (2013.01); *G03F 7/0382* (2013.01); *G03F 7/095* (2013.01); *G03F 7/11* (2013.01); *G03F 7/2037* (2013.01); *G03F 7/32* (2013.01); *G03F 7/322* (2013.01); *G03F 7/325* (2013.01)

(58) Field of Classification Search
CPC ........................................................ G03F 1/00
See application file for complete search history.

(56) References Cited

U.S. PATENT DOCUMENTS

2001/0026895 A1    10/2001    Itoh et al.
2004/0013975 A1    1/2004    Kon et al.
(Continued)

FOREIGN PATENT DOCUMENTS

JP    H07-86119 A    3/1995
JP    H07-86127 A    3/1995
(Continued)

OTHER PUBLICATIONS

May 10, 2018 Office Action issued in Japanese Patent Application No. 2014-164855.
(Continued)

*Primary Examiner* — Kathleen Duda
(74) *Attorney, Agent, or Firm* — Oliff PLC

(57) ABSTRACT

A mask blank with resist film, including a substrate having a thin film; and a negative resist film formed on a main surface of the thin film, wherein in the resist film, a photoacid generator-rich region in which concentration of a photoacid generator is high compared to other region of the resist film, is formed at a portion where the resist film is in contact with the thin film.

12 Claims, 10 Drawing Sheets

(51) Int. Cl.
*G03F 7/004* (2006.01)
*G03F 7/038* (2006.01)
*G03F 7/20* (2006.01)

(56) References Cited

U.S. PATENT DOCUMENTS

| | | |
|---|---|---|
| 2005/0277055 A1 | 12/2005 | Kon |
| 2010/0273098 A1 | 10/2010 | Ogawa et al. |
| 2012/0251930 A1 | 10/2012 | Kojima et al. |

FOREIGN PATENT DOCUMENTS

| | | | |
|---|---|---|---|
| JP | H07-325382 A | 12/1995 | |
| JP | 2001-264983 A | 9/2001 | |
| JP | 2004-045513 A | 2/2004 | |
| JP | 2006-023699 A | 1/2006 | |
| JP | 2006-287236 A | 10/2006 | |
| JP | 2011-123426 A | 6/2011 | |
| WO | 2008/044741 A1 | 4/2008 | |
| WO | 2009/084516 A | 7/2009 | |

OTHER PUBLICATIONS

Oct. 20, 2015 International Search Report issued in International Patent Application No. PCT/JP2015/071195.

(2-A)
PREPARING A
SUBSTRATE WITH THIN
FILM (MASK BLANK)

(2-B-a)
FORMING
A RICH LAYER (2-B-b)
FORMING
A DILUTE LAYER

MASK BLANK WITH RESIST FILM AND METHOD FOR MANUFACTURING THE SAME AND METHOD FOR MANUFACTURING TRANSFER MASK

TECHNICAL FIELD

The present invention relates to a mask blank with resist film and a method for manufacturing the same and a method for manufacturing a transfer mask.

DESCRIPTION OF RELATED ART

A technique of forming a resist film using a negative chemically amplified resist and forming a resist pattern from the resist film is attracting attention because a fine pattern can be formed.

A mechanism of the negative chemically amplified resist is briefly described as follows. First, a photo acid generator (Photo Acid Generator: PAG) is contained in the resist solution. At the same time, a compound capable of causing photocrosslinking or photopolymerization reaction is contained therein. Exposure is performed after applying a resist solution, baking the same, and forming a film. Acid is generated due to a photoacid generator at a place where exposure is performed. The photocrosslinking and the photopolymerization reaction are advanced or promoted by this acid. In this manner, the exposed portion is hardened. Then, by developing the resist film, a non-exposed portion is removed, and only an exposed portion remains, so that a resist pattern is formed. Hereinafter, the negative type chemically amplified resist is abbreviated and is also called a "negative resist".

When a negative resist is used while forming a fine pattern, thinning or undercut occurs at a root of the pattern in some cases.

Various reasons can be considered, but one of the reasons is that when exposure is performed from the outermost surface of the resist film, the exposure light attenuates toward the bottom of the resist film and an exposure amount decreases. In such a case, sufficient exposure can not be performed in the vicinity of the thin film in contact with the resist film (the bottom portion of the resist film, hereinafter referred to as the "root of the pattern"). As a result, thinning or undercut occurs at the root of the pattern.

Even if sufficient exposure is performed at the bottom portion of the resist film, the thinning or undercut occurs at the time of development processing or etching applied to the thin film using the resist pattern as a mask.

Another reason why the thinning or undercut occurs is a case where a thin film provided under the resist film adversely affects the formation of the resist pattern.

For example, paragraph [0008] of patent document 1 describes as follows. For example, when the resist film is formed on a chromium (Cr)-based thin film, the acid generated from the photoacid generator is inactivated due to the influence of Cr. As a result, the portion of the resist film in contact with the Cr-based thin film (hereinafter simply referred to as "Cr film") has less acid and consequently the degree of photopolymerization becomes smaller. In such a case, the thinning or undercut as described above is likely to occur in the resist pattern.

In order to solve the above problem, Patent Document 1 discloses that the thin film in contact with the resist film is treated so as not to contain chromium.

PRIOR ART DOCUMENT

Patent Document

Patent document 1: Japanese Patent Laid Open Publication No. 2011-123426

SUMMARY OF THE INVENTION

Problem to be Solved by the Invention

Although it is possible to exclude the influence of Cr in the technique of Patent Document 1, in other words, restriction is imposed on the substance which can be used as the thin film provided under the resist film, and the degree of freedom in designing a mask blank is greatly lost.

An object of the present invention is to provide a technique capable of forming a good resist pattern while maintaining a high degree of freedom in designing the mask blank.

Means for Solving the Problem

As a simple technique for solving the abovementioned problem, it is sufficient to increase the concentration of the acid in the vicinity of the thin film in the resist film. However, no technique has been found to increase the concentration of acid in the region at a pinpoint. Therefore, in order to increase the concentration of the acid in the entire resist film, a technique of increasing the concentration of the photoacid generator that generates acid can be considered.

However, in the case of simply increasing the concentration of the photoacid generator in the entire resist film, the problem of reduction of resolution occurs in turn. When the concentration of the photoacid generator is high, acid is generated due to a scattered light such as forward scattering and backward scattering, thus involving a problem that the resist film is cured even though it is a non-exposed portion.

In addition, after examination by inventors of the present invention, it is found that thinning or undercut are sometimes occur or sometimes don't occur, depending on the kind of an element constituting the thin film. The inventors of the present invention consider it necessary to investigate the cause, to increase the degree of freedom of the element constituting the thin film of the mask blank.

As a result of intensive studies by the inventors of the present invention, it is found that in the case of the mask blank in which Cr is used as the thin film, the concentration of the photoacid generator in the vicinity of the Cr film in the resist film is reduced to about half. As described in Patent Document 1, it is conventionally known that an acid concentration is decreased due to Cr, but it is found by the inventors of the present invention that the concentration of the photo acid generator is about half in the vicinity of the Cr film. Moreover, this tendency largely differs depending on the elements constituting the thin film. For example, when Ta or $SiO_2$ is used in the thin film, there is almost no tendency as described above.

Based on this knew knowledge, the inventors of the present invention carried out intensive studies regarding a technique of forming a good resist pattern using the negative resist, irrespective of the kind of element constituting the thin film, and as a result, reach a technique of forming a region rich in the photoacid generator so as to be in contact with the thin film in the resist film provided on the mask blank. With such a configuration, it is possible to compensate for the decrease of the concentration of the photoacid generator at the root of the resist pattern in the case of using Cr for a thin film. In the case of using Ta or $SiO_2$ for the thin film, the root of the resist pattern can be strong by increasing the concentration of the photoacid generator at the root of the resist pattern.

The configuration of the present invention based on the above knowledge is as follows.

<Configuration 1>

A first configuration of the present invention is a mask blank with resist film, including:

a substrate having a thin film; and a negative resist film formed on a main surface of the thin film, wherein in the resist film, a photoacid generator-rich region in which concentration of a photoacid generator is high compared to other region of the resist film, is formed at a portion where the resist film is in contact with the thin film.

According to this configuration, even if the concentration of the photoacid generator is decreased due to the thin film, it is possible to compensate for the decrease by the photoacid generator-rich region. On the other hand, even when the concentration of the photoacid generator does not decrease due to the thin film, the root of the resist pattern can be strong. As a result, swelling of the resist pattern can be suppressed. Even if a skirt portion is formed at the root of the resist pattern (that is, the root has a thicker shape), the root of the resist pattern is dragged in the development processing or the etching applied to the thin film, and eventually the resist pattern is formed perpendicularly to the resist pattern. As a result, a satisfactory resist pattern can be formed while maintaining a high degree of freedom in designing the mask blank.

<Configuration 2>

A second configuration of the present invention is the mask blank with resist film of the first configuration, wherein the resist film is constituted by a plurality of layers, and among the plurality of layers, a layer in which the resist film is in contact with the thin film, is a rich layer in which concentration of the photoacid generator is high.

By forming the photoacid generator-rich region on the main surface of the thin film as a rich layer, the rich layer can act as a supply source of the photoacid generator, and the effect described in configuration 1 can be reliably achieved and further enhanced.

<Configuration 3>

A third configuration of the present invention is the mask blank with resist film of the second configuration, wherein a dilute layer having a dilute photoacid generator compared to the rich layer is formed on an outermost surface side of the resist film viewed from the rich layer; and an intermediate region having a concentration between a concentration of the dilute layer and a concentration of the rich layer is formed between the dilute layer and the rich layer.

By forming the intermediate region, the concentration of the photoacid generator is gradually increased from the dilute layer to the rich layer. On the other hand, the concentration of the photoacid generator is gradually decreased due to the thin film, from the vicinity of the thin film to the outermost surface of the resist film. As a result, the increase of the concentration and the decrease of the concentration cancel each other, and it is possible to finally obtain a resist pattern that is extremely homogeneous in the thickness direction of the resist film.

<Configuration 4>

A fourth configuration of the present invention is the mask blank with resist film of the second or third configuration, wherein the photoacid generator in the rich layer does not contain trifluoromethyl as anion.

When the resist film is constituted by a plurality of layers, a critical surface energy is lowered if the photo acid generator in the rich layer contains trifluoromethyl as anion. As a result, there is a problem that the rich layer is hardly adhered to the main surface of the thin film. Therefore, by setting the photoacid generator in the rich layer so as not to contain trifluoromethyl as anion, the concentration of the photoacid generator at the portion in contact with the thin film in the rich layer can be reliably increased.

<Configuration 5>

A fifth configuration of the present invention is a method for manufacturing a mask blank with resist film, including the steps of:

preparing a substrate having a thin film; and forming a negative resist film on a main surface of the thin film, wherein the step of forming a resist film further includes the steps of:

forming a rich layer in which a photoacid generator is rich, by coating the main surface of the thin film with a photoacid generator-rich solution and baking it; and forming a dilute layer in which the photoacid generator is dilute compared to the rich layer, by coating a main surface of the rich layer with a resist solution and baking it.

According to this configuration, the same effect as described in configurations 1 and 2 can be exerted.

<Configuration 6>

A sixth configuration of the present invention is the method of the fifth configuration, wherein the photoacid generator contained in a solution used in the step of forming a rich layer does not contain trifluoromethyl as anion.

According to this configuration, the same effect as described in the fourth configuration can be exerted.

<Configuration 7>

A seventh configuration of the present invention is a method for manufacturing a transfer mask, including the step of:

forming an uneven pattern on at least a thin film out of a mask blank by using the mask blank with resist film of any one of the first to fourth configurations.

According to this configuration, the same effect as described in the first configuration can be exerted.

<Configuration 8>

An eighth configuration of the present invention is a method for manufacturing a transfer mask using the mask blank with resist film of any one of first to fourth configurations, including the step of:

forming a pattern on the resist film, wherein the step of forming the resist pattern further includes the steps of:

electron beam drawing of the resist film; and developing the resist film, wherein the developing solution used in the developing step is an organic solvent developing solution.

When the negative resist film is developed using the organic solvent developing solution, thinning or undercut is likely to occur at the root of the resist pattern. However, by adopting the above configuration, the occurrence of the abovementioned trouble can be suppressed.

Advantage of the Invention

According to the present invention, it is possible to provide a technique capable of forming a good resist pattern while maintaining a high degree of freedom in designing the mask blank.

DETAILED DESCRIPTION OF THE INVENTION

Embodiments of the present invention will be described in detail hereafter.

In this embodiment, explanation is given in the following order.
1. Mask blank with resist film
 1-A) Substrate with thin film
 1-B) Resist film
  1-B-a) Rich layer (photoacid generator-rich region)
  1-B-b) Dilute layer
  1-B-c) Intermediate region
2. Method for manufacturing a mask blank
 2-A) Preparing a substrate with thin film (mask blank)
 2-B) Forming a resist film
  2-B-a) Forming a rich layer
  2-B-b) Forming a dilute layer
3. Method for manufacturing a transfer mask
 3-A) Exposure step
 3-B) Developing step
 3-C) Etching step
 3-D) Others For a configuration not described below, a publicly-known configuration (for example, Japanese Patent Laid-open Publication No. 2013-257593 provided by the present applicant) may be appropriately adopted. In this specification, the contents of Japanese Patent Publication No. 2013-257593 are described regarding the matters such as the configuration, etc., of the thin film which are not particularly described.

<1. Mask Blank with Resist Film 1>

Figure 1:
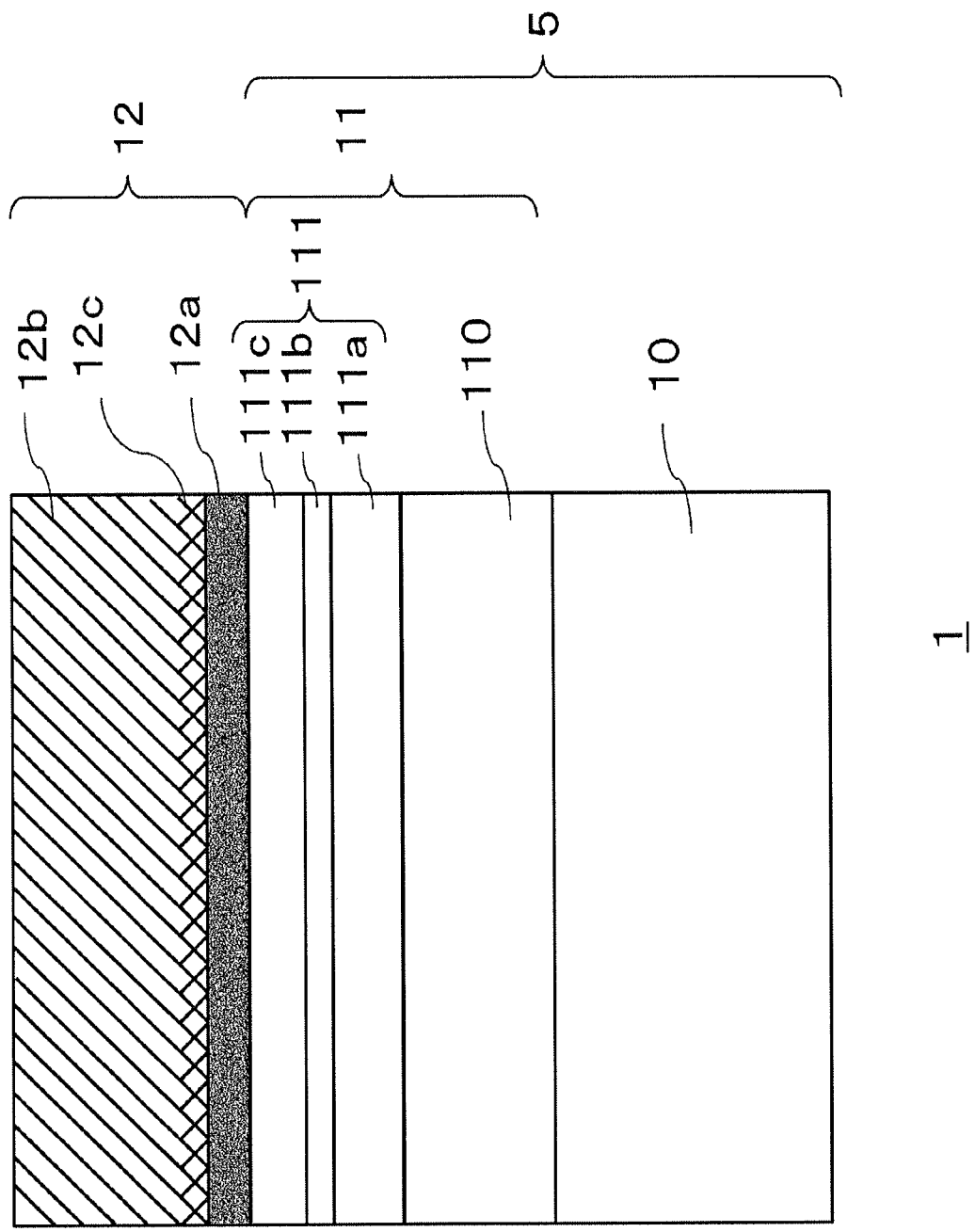
FIG. 1 is a cross-sectional schematic view of a mask blank with resist film according to an embodiment.
Figure 2:
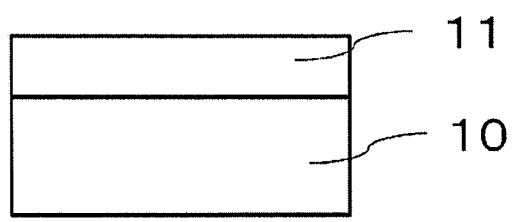
FIG. 2 is a cross-sectional schematic view showing a method for manufacturing the mask blank with resist film according to an embodiment.
Figure 2:
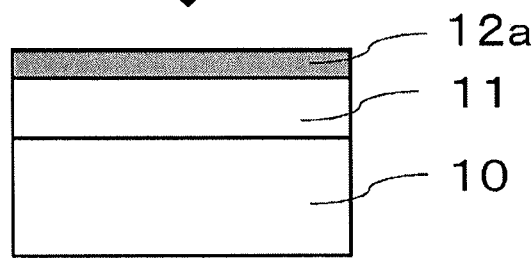
Figure 2:
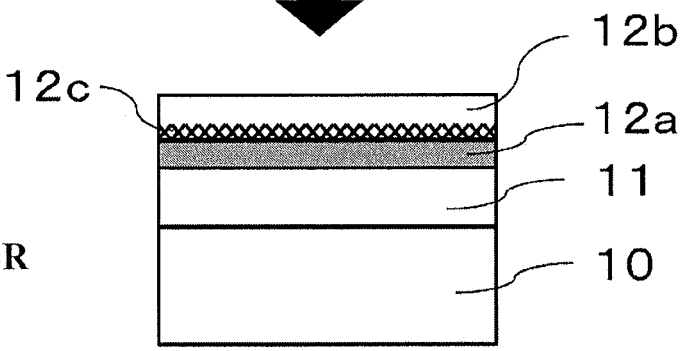

A mask blank with resist film 1 of this embodiment will be described using FIG. 1. FIG. 1 is a cross-sectional schematic view of a mask blank with resist film 1 according to this embodiment. As illustrated in FIG. 1, in the mask blank with resist film 1 of this embodiment, a thin film 11 is formed on a main surface of a substrate 10, and a resist film 12 is formed on the thin film 11. Each structure will be described hereafter.

1-A) Substrate with Thin Film (Mask Blank 5)

A glass substrate can be used as the substrate 10 of this embodiment. In a case of a transmitting mask, the substrate 10 is selected to be a glass material having a high transmittance for an exposure light when forming a pattern on a wafer. In a case of a reflective mask, a low thermal expansion glass is selected, which is capable of minimizing a thermal expansion of the substrate 10 caused by energy of the exposure light.

Specifically, in a case of the transmitting mask (for example, a binary mask, a phase shift mask and a gray tone mask), examples of the material of the substrate 10 include synthetic quartz glass, soda lime glass, aluminosilicate glass, borosilicate glass, and alkali-free glass, etc. As a detailed example, a synthetic quartz glass can be preferably used, which has a high transmittance for light having a wavelength of 300 nm or less is preferably used for a substrate 10 of a transfer type mask using an ArF excimer laser with a wavelength of 193 nm or a KrF excimer laser with a wavelength of 254 nm as exposure light.

In a case of an EUV mask which is a reflective mask, $SiO_2$—$TiO_2$ glass which is a glass material having a low thermal expansion coefficient within a range of about $0\pm1.0\times10^{-7}/°$ C., and more preferably in a range of about $0\pm0.3\times10^{-7}/°$ C., can be used as the substrate 10, to suppress a distortion of a pattern to be transferred due to a heat during exposure.

Next, as illustrated in FIG. 1, the thin film 11 is formed on the main surface of the substrate 10. The element constituting the thin film 11 formed on the main surface of the substrate 10 and under the resist film 12, is selected according to the purpose of use of the transfer mask manufactured from the mask blank 5. However, when the thin film 11 is a Cr film, the acid is deactivated by the Cr film. In addition, the concentration of the photoacid generator, which is the phenomenon found by the present inventor, is halved. Therefore, when the photoacid generator serving as a source of acid is rich in the vicinity of the thin film 11, it becomes possible to compensate for the decrease of the photoacid generator and, consequently, compensate for the inactivated portion of the acid. In other words, when the thin film 11 is a Cr film, thinning or undercut is likely to occur at the root of the resist pattern, but by adopting the configuration of this embodiment, the occurrence of the above defect can be suppressed. However, of course, an object of the present invention is to keep high degree of freedom in selecting the thin film 11, and therefore the present invention is not limited to the case in which the thin film 11 is the Cr film. Rather, even when the thin film 11 is a Ta film or $SiO_2$ film, the following remarkable effect can be exerted. That is, the root of the resist pattern can be strong. As a result, swelling of the resist pattern can be suppressed. Even when the skirt portion is formed at the root of the resist pattern (that is, the root has a thicker shape), the root of the resist pattern is dragged in the development or the etching applied to the thin film 11, and after all the resist pattern is formed perpendicularly to the thin film 11. As a result, the satisfactory resist pattern can be formed while maintaining the high degree of freedom in designing the mask blank 5.

Specific structures of the thin film 11 can be listed as following (1) to (5).

(1) Thin Film 11 of a Binary Mask

In a case of producing a binary mask blank, the thin film 11 having a light shielding film 111 is formed on the substrate 10 having transmitting property to a light having an exposure wavelength. The light shielding film 111 is made of a transition metal simple substance such as chromium, tantalum, ruthenium, tungsten, titanium, hafnium, molybdenum, nickel, vanadium, zirconium, niobium, palladium, rhodium or the like, or a compound thereof. For example, the light shielding film 111 made of chromium or a chromium compound in which one or more elements selected from elements such as oxygen, nitrogen, carbon and the like are added to chromium, can be used. Further, the light shielding film 111 made of a tantalum compound in which one or more elements selected from elements such as oxygen, nitrogen, boron and the like are added to tantalum, can be used.

In the thin film 11, the light shielding film 111 has a two-layer structure of a light shielding layer and a main surface antireflection layer, and a three-layer structure in which a back surface antireflection layer is added between the light shielding layer and the substrate 10. Alternatively, the composition gradient film in which the composition is continuously or stepwise different in a film thickness direction of the light shielding film 111, may be selected as the thin film 11.

Alternatively, the thin film 11 may have a structure having an etching mask film on the light shielding film 111. The etching mask film is preferably made of a material composed of chromium or a chromium compound in which elements such as oxygen, nitrogen and carbon are added to chromium having etching selectivity (having etching resistance) to the etching applied to the light-shielding film 111 containing transition metal silicide. At this time, by imparting the antireflection function to the etching mask film, a transfer mask may be formed in a state in which the etching mask film remains on the light shielding film 111.

(2) Thin Film 11 of a Binary Mask Having Other Structure

Further, as another example of the thin film 11 of the binary mask, there is also a structure including the light shielding film 111 made of a material containing a compound of a transition metal and silicon (including transition metal silicide, particularly, molybdenum silicide).

The light shielding film 111 made of a material containing a compound of the transition metal and silicon, and a material containing these transition metals and silicon, and mainly composed of oxygen and/or nitrogen can be used. Also, the light shielding film 111 made of the transition metal, and mainly composed of oxygen, nitrogen, and/or boron, can be used. As transition metals, molybdenum, tantalum, tungsten, titanium, hafnium, nickel, vanadium, zirconium, niobium, palladium, ruthenium, rhodium, chromium and the like can be used.

Particularly, when the light shielding film 111 is formed by a compound of molybdenum silicide, there are structures such as a two-layer structure of a light shielding layer (MoSi or the like) and a main surface antireflection layer (MoSiON or the like), and a three-layer structure of a back surface antireflection layer (such as MoSiON) between the light shielding layer and the substrate 10.

Alternatively, the composition gradient film may be used as the light shielding film 111, in which the composition is continuously or stepwise different in its film thickness direction.

(3) Thin Film 11 of a Halftone Type Phase Shift Mask

When the halftone type phase shift mask is produced, the thin film 11 is formed on the substrate 10 having a light transmitting property to the wavelength of the exposure light used during transfer, the thin film 11 having a light semi-transmitting film 110 made of a material containing a compound of the transition metal and silicon (including transition metal silicide, and particularly molybdenum silicide).

The light semi-transmitting film 110 included in the thin film 11 transmits the light having an intensity that does not substantially contribute to exposure (for example, 1% to 30% of the exposure wavelength), and has a predetermined phase difference (for example, 180 degrees). The halftone type phase shift mask has a light semi-transmitting portion obtained by patterning the light semi-transmitting film 110, and a light transmitting portion for transmitting a light having an intensity that substantially contributes to exposure in which the light semi-transmitting film 110 is not formed. As a result, a phase of a light that transmits through the light semi-transmitting portion and a phase of a light that transmits through the light transmitting portion are substantially inverted with each other, so that the lights which have passed through the vicinity of a boundary part between the light semi-transmitting portion and the light transmitting portion and diffracted to the other region by a diffraction phenomenon cancel out each other, and the light intensity at the boundary part is made substantially zero to improve the contrast or resolution at the boundary part.

The light semi-transmitting film 110 is made of a material containing the compound of the transition metal and silicon (including a transition metal silicide) for example, and the material mainly composed of these transition metals and silicon, and oxygen and/or nitrogen can be used. As the transition metals, molybdenum, tantalum, tungsten, titanium, hafnium, nickel, vanadium, zirconium, niobium, palladium, ruthenium, rhodium, chromium and the like can be used.

In a case of a structure including the light shielding film 111 on the light semi-transmitting film 110, since the material of the light semi-transmitting film 110 contains the transition metal and silicon, particularly chromium having etching selectivity (having etching resistance) to the light semi-transmitting film 110, and the chromium compound in which elements such as oxygen, nitrogen, and carbon are added to chromium, are preferably used as the material of the light shielding film 111.

(4) Thin Film 11 of a Multi-Tone Mask

The thin film 11 of a multi-tone mask has a lamination structure of one or more semi-transmitting films and the light shielding film 111.

The material of the semi-transmitting film includes simple metals such as chromium, tantalum, titanium and aluminum, alloys or compounds thereof, in addition to the same elements as those of the light semi-transmitting film 110 of the halftone type phase shift mask blank.

The composition ratio and the film thickness of each element are adjusted so as to obtain a predetermined transmittance to the exposure light. For the material of the light shielding film 111 of the binary mask blank, the material of the light shielding film 111 can be used, and in the lamination structure including the semi-transmitting film, the material composition and the film thickness of the light shielding film 111 are adjusted so as to obtain a predetermined light shielding performance (optical density).

(5) Thin Film 11 of a Reflective Mask

The thin film 11 of the reflective mask has a structure in which a multilayer reflective film that reflects the exposure light is formed on the substrate 10 and an absorber film that absorbs the exposure light is formed on the multilayer reflective film in a patterned shape. Light (EUV light) incident on the reflective mask mounted on an exposure machine (pattern transfer device) is absorbed at a portion where the absorber film is present, and a light image reflected by the multilayer reflective film is transferred to a semiconductor substrate through a reflection optical system.

The multilayer reflective film is formed by alternately laminating a high refractive index layer and a low refractive index layer. Examples of the multilayer reflective film, include a Mo/Si cyclic laminated film in which Mo film and Si film are alternately laminated by about 40 cycles, Ru/Si cyclic multilayer film, Ru/Si cyclic multilayer film, Mo/Be cyclic multilayer film, Mo compound/Si compound cyclic multilayer film, Si/Nb cyclic multilayer film, Si/Mo/Ru cyclic multilayer film, Si/Mo/Ru/Mo cyclic multilayer film, Si/Ru/Mo/Ru cyclic multilayer film, and the like. The material can be suitably selected depending on the exposure wavelength.

Further, the absorber film has a function of absorbing, for example, EUV light which is the exposure light, and for example, a material containing tantalum (Ta) as a simple substance or a material containing Ta as a main component can be preferably used. The crystalline state of such an absorber film is preferably has an amorphous or microcrystalline structure from a viewpoint of smoothness and flatness.

1-B) Resist Film 12

Next, as illustrated in FIG. 1, a resist film 12 is formed on the thin film 11 of the mask blank 5. The resist film 12 of this embodiment is constituted of a plurality of layers.

The resist film 12 in this embodiment is a film containing a negative chemically amplified resist (negative resist) and a photoacid generator. However, negative resist is not required to be contained in all layers constituting the resist film 12. For example, as shown in example 3 described later, a layer in which high concentration of the photoacid generator is contained not in the negative resist but in simply the thermosetting resin, is provided on the main surface of the thin film 11 as a resist underlayer 12a (so-called rich layer 12a and having a photo acid generator-rich region) and the negative resist may be applied thereon, which may be then baked. In other words, in this embodiment, a film including the resist underlayer 12a as a base of the resist film 12, which is a layer provided at a portion in contact with the thin film 11, is called a "resist film 12".

Each layer (region) constituting the resist film 12 will be described below. Specific compounds and amounts constituting each layer (area) are listed at the end of this item.

1-B-a) Rich Layer 12a (Photoacid Generator-Rich Region)

In this embodiment, among the plurality of layers constituting the resist film 12, the layer in which the resist film 12 is in contact with the thin film 11 is the rich layer 12a which is rich in the photoacid generator. The rich layer 12a is also referred to as a photoacid generator-rich region.

In this specification, the "photoacid generator-rich region" refers to a "region where the concentration of the photoacid generator is high compared to other region of the resist film". More specifically, "other region of the resist film" refers to a region other than the photoacid generator-rich region of the resist film 12. That is, the "region where the concentration of the photoacid generator is high compared to other region" means that the concentration of the photoacid generator when viewed from the entire photoacid generator-rich region is higher than the concentration of the photoacid generator when viewed from the entire region other than the photoacid generator-rich region in the resist film 12. In other words, even if a layer having a high photoacid generator concentration is formed thin in the vicinity of the outermost surface in the resist film 12, separately from the rich layer 12a, the concentration of the photoacid generator when viewed from the entire region above the rich 12a, is still low compared to the concentration of the photoacid generator when viewed from the entire rich layer 12a, and this case also belongs to a technical scope of the present invention.

As described above, the rich layer 12 a may not be made of a negative resist as a raw material. For example, a solvent capable of dissolving the photoacid generator at a high concentration without using the negative resist may also be used. In this case, the solvent in which the photoacid generator is dissolved at a high concentration is applied on the thin film 11 and baked to form the rich layer 12a on the thin film 11. Needless to say, the negative resist may be used as a raw material, and it may be the same kind as the negative resist used in the dilute layer 12b described later, or may be different.

It is preferable that the photoacid generator in the rich layer 12a does not contain trifluoromethyl as anion. As described above, when the resist film 12 is composed of a plurality of layers, critical surface energy becomes low if the photo acid generator in the rich layer 12a has trifluoromethyl as anion. As a result, there is a possibility that the rich layer 12a is less likely to adhere to the main surface of the thin film 11. Therefore, by setting the photoacid generator in the rich layer 12a so as not to contain trifluoromethyl, the concentration of the photoacid generator can be reliably increased at the portion of the rich layer 12a in contact with the thin film 11.

1-B-b) Dilute Layer 12b

The dilute layer 12b having a dilute photoacid generator concentration compared to the rich layer 12a is formed on the outermost surface side of the resist film 12 viewed from the rich layer 12a. Preferably, the dilute layer 12b is formed on the outermost surface of the resist film 12. The dilute layer 12b of this embodiment contains the photo acid generator while using the negative resist as a raw material. The term "dilute" used herein means that the concentration of the photoacid generator is relatively lower than that of the rich layer 12a, and does not mean an absolute low concentration to the extent that reduces a resolution of the resist film 12.

1-B-c) Intermediate Region 12c

In this embodiment, an intermediate region 12c having a concentration between the concentration of the dilute layer 12b and the concentration of the rich layer 12a is formed between the dilute layer 12b and the rich layer 12a. As described above, by forming the intermediate region 12c, the concentration of the photoacid generator is gradually increased from the dilute layer 12b to the rich layer 12a. On the other hand, the concentration of the photoacid generator is gradually decreased due to the thin film, from the vicinity of the thin film to the outermost surface of the resist film. As a result, the increase of the concentration and the decrease of the concentration cancel each other, and it is possible to finally obtain a resist pattern that is extremely homogeneous in the thickness direction of the resist film.

The intermediate region 12c may be formed by raw materials of the mixture of the rich layer 12a and the dilute layer 12b that already exist in the step of forming the dilute layer 12b, or may be formed by a third layer separately from the dilute layer 12b and the rich layer 12a.

In this embodiment, the resist film 12 is constituted of a plurality of layers, but the resist film 12 may be constituted of one layer. In this case, rich or dilute of the photoacid generator concentration must be determined in one layer. An example of how to determine rich or dilute is that, for example, a small amount of the photoacid generator having polarity and the photo acid generator having no polarity are used in combination. In this case, when the negative resist is applied, a small amount of the photoacid generator having polarity is concentrated on the main surface side. Then, the photoacid generator having no polarity naturally gets driven to the thin film side. In such a case, a large amount of photoacid generator having no polarity relatively gathers in the vicinity of the thin film 11.

Even in cases other than these examples, the photoacid generator-rich region may be formed in the vicinity of the thin film 11 in the resist film 12 constituted of one layer, by appropriately adjusting the number of types of photoacid generators, the type itself, the temperature at the time of baking, a substance to be mixed in the negative resist, and an amount thereof, etc.

The above contents are the contents of each layer constituting the resist film 12. Specific compounds and amounts constituting each layer (region) are listed below. In this specification, for example, "10% to 40%" means a prescribed numerical value (10%) or more and prescribed numerical value (40%) or less. Further, the compounds listed below may be used alone, or a combination of these compounds may be used.

(Negative Resist)

A publicly-known one may be used as the negative resist of this embodiment. For example, a negative chemically amplified resist described in JP-A-2014-106299 may be used.

(Crosslinking Agent)

Examples of the crosslinking agent include alkoxymethylglycolurils and alkoxymethylmelamines. Specific examples thereof include tetramethoxymethylglycoluril, 1,3-bismethoxymethyl-4,5-bismethoxyethylene urea, bis Methoxymethyl urea, hexamethoxymethyl melamine, hexaethoxymethyl melamine, and the like.

0.5 to 5 parts by mass of the crosslinking agent is preferably contained in the negative resist based on 100 parts by mass of polymer, as an amount of the crosslinking agent. Within this range, the function of the negative resist can be sufficiently exerted, and also reduction of the resolution due to curing of an unexposed portion, can be stopped.

(Photoacid Generator)

Examples of the photoacid generator include compounds described in JP-A No. 2013-164588, onium salts such as diazonium salts, sulfonium salts and iodonium salts, organic halogen compounds, photoacid generators having an o-nitrobenzyl type protective group, iminosulfonate compounds, disulfone compounds, diazoketosulfonic acid, diazodisulfone compounds, oxime sulfonate compounds, and the like.

2 to 20 parts by mass (preferably 5 to 15 parts by mass.) of the photoacid generator is preferably contained in the negative resist based on 100 parts by mass of polymer, as an amount of the photoacid generator. Within this range, the function of the negative resist can be sufficiently exerted, and also reduction of the resolution due to curing of an unexposed portion, can be stopped.

(Basic Compound)

Examples of the basic compound include primary, secondary and tertiary aliphatic amines, mixed amines, aromatic amines, heterocyclic amines, nitrogen-containing compounds having a carboxyl group, nitrogen-containing compounds having a sulfonyl group, nitrogen-containing compounds having a hydroxyl group, nitrogen-containing compounds having a hydroyphenyl group, alcoholic nitrogen-containing compounds, amids, imides, carbamates, ammonium salts, and the like.

Particularly preferred basic compounds include tris (2-(methoxymethoxy) ethyl) amine, tris (2-(methoxymethoxy) ethyl) amine N-oxide, morpholine derivative, imidazole derivative and the like.

0.01 to 5 parts by mass (preferably 0.05 to 3 parts by mass.) of the basic compound is preferably contained in the negative resist based on 100 parts by mass of polymer, as an amount of the basic compound. Within this range, the function of the negative resist can be sufficiently exerted, and also reduction of the resolution due to curing of an unexposed portion, can be stopped.

(Solvent)

The solvent in this embodiment can also be used for forming the resist underlayer 12a mentioned above and can also be used as the negative resist.

Solvents include an organic solvent capable of dissolving a polymer compound, an acid generator, and other additives, etc., such as ketones such as methyl isobutyl ketone, cyclohexanone and 2-heptanone, ethers such as propylene glycol monomethyl ether (PGME, aka 1-methoxy-2-propanol), propylene glycol monoethyl ether, ethylene glycol monomethyl ether, ethylene glycol monoethyl ether, propylene glycol dimethyl ether, diethylene glycol dimethyl ether, esters such as methyl 3-methoxypropionate, ethyl 3-ethoxypropionate, methyl β-methoxyisobutyrate, ethyl butyrate, propyl butyrate, propylene glycol monomethyl ether acetate (PGMEA, also known as 1-methoxy-2-acetoxypropane), propylene glycol monoethyl ether Acetate, ethylene glycol monomethyl ether acetate, ethyl acetate, isoamyl acetate, ethyl lactate, butyl acetate, tert-butyl acetate, tert-butyl propionate, propylene glycol mono tort-butyl ether acetate, cyclohexyl acetate, alcohols such as 3-methoxybutanol, 3-methyl-3-methoxybutanol, 1-methoxy-2-propanol, diacetone alcohol, and in addition, N-methyl pyrrolidone, N, N-dimethylformamide, γ-butyrolactone, N, N-dimethylacetamide, propylene carbonate, ethylene carbonate, toluene, xylene, and the like.

Among the abovementioned compounds, ethyl lactate, propylene glycol monomethyl ether, propylene glycol monomethyl ether acetate or the like having the best solubility of the photo acid generator is preferably used as the solvent for forming the rich layer 12a. By using these solvents, precipitation (segregation) of the acid generator in the resist film can be suppressed.

The amount of the solvent used in this embodiment is preferably from 1,000 to 10,000 parts by mass, particularly preferably from 2,000 to 9,700 parts by mass, based on 100 parts by mass of the whole polymer. By adjusting the concentration to such a level, it is possible to stably obtain the resist film 12 having a film thickness of 10 to 300 nm with good flatness by using a spin coating method.

The main structure of the mask blank with resist film 1 of this embodiment has been described above. Other publicly-known layers (films) may be provided on the mask blank 5 as long as they have the above structure. For example, a protective film may be provided on the main surface of the resist film 12.

<2. Method for Manufacturing the Mask Blank with Resist Film 1>

Figure 3:
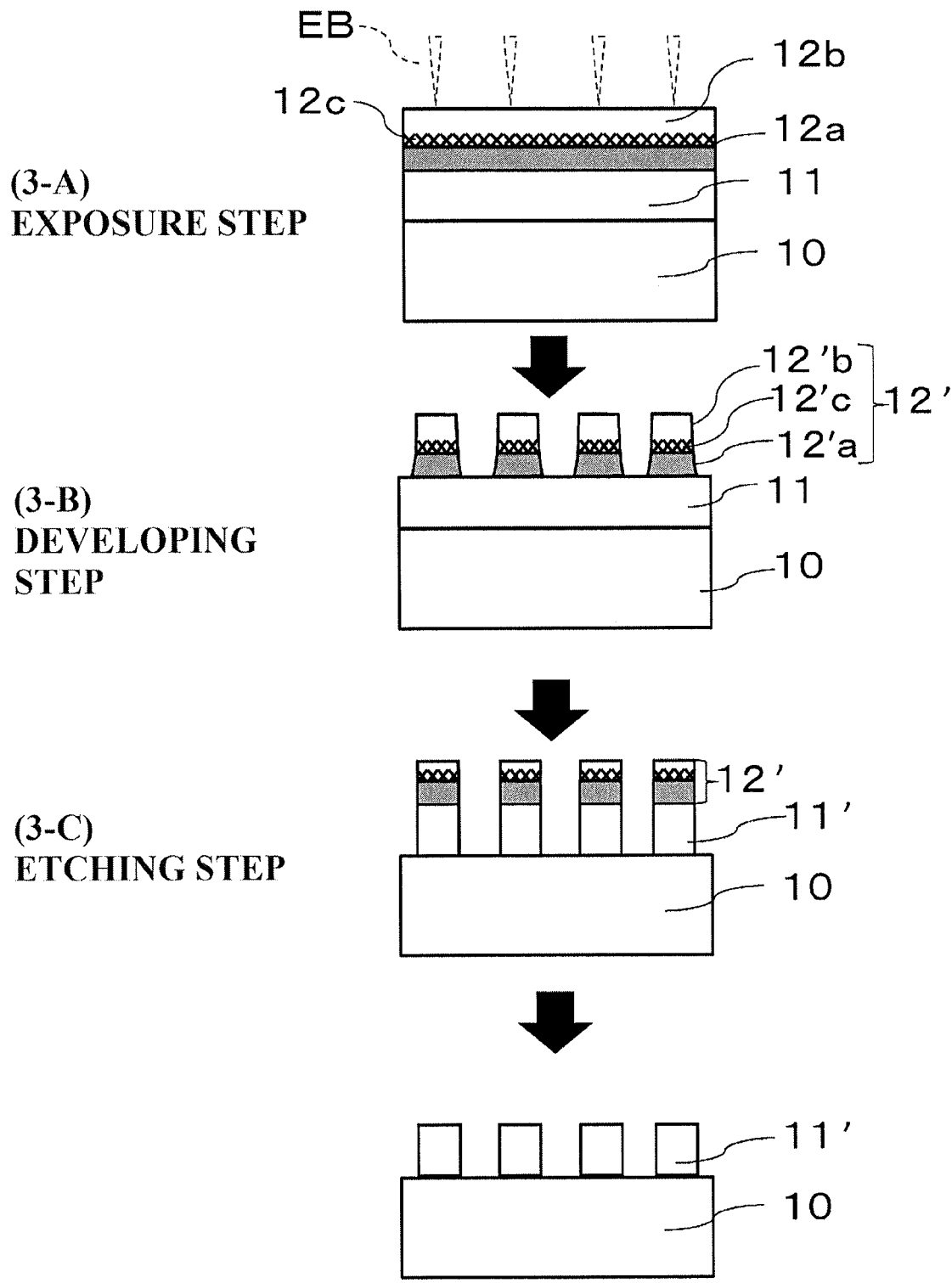
FIG. 3 is a cross-sectional schematic view showing a method for manufacturing a transfer mask, according to an embodiment.

Next, a method for manufacturing the mask blank with resist film 1 of this embodiment will be described, with reference to FIG. 3. FIG. 3 is a schematic cross-sectional view illustrating the method for manufacturing the mask blank with resist film 1 of this embodiment. Some of the contents of the following steps is overlapped with the content described in <1. Mask blank with resist film 1>. Therefore, for contents not described below, explanation is already given in <1. Mask blank with resist film 1>.

This embodiment shows an example of preparing the substrate 10 and forming the thin film 11 on the substrate 10 in the following 2-A) Preparing the substrate with thin film. However, the following embodiment is also included in the embodiment of the present invention: the mask blank 5 with the thin film 11 formed thereon is prepared in advance, and the resist film 12 is formed thereon.

2-A) Preparing the Substrate with Thin Film (Mask Blank 5)

First, the substrate 10 is prepared. Next, the thin film 11 is formed on the main surface of the substrate 10. A publicly-known method may be used as a specific structure and for preparing the substrate with thin film. This embodiment shows a case in which the semi-transmitting film 110 and the light-shielding film 111 are provided on the substrate 10 made of quartz glass, and such a substrate with thin film is used as the mask blank 5.

2-B) Forming the Resist Film

In this step, the resist film 12 is formed on the main surface of the thin film 11 using a chemically amplified resist (negative resist). At this time, the rich layer 12a and the dilute layer 12b are formed. Then, when the dilute layer 12b is formed, the intermediate region 12c is formed in which the rich layer 12a and the dilute layer 12b coexist.

2-B-a) Forming the Rich Layer

In this step, a photoacid generator-rich solution is applied on the main surface of the thin film 11 and baked to form the rich layer 12a having a high concentration of the photoacid generator. As a specific method, a publicly-known method may be used. As an example, HMDS treatment is applied to the main surface of the thin film 11, and thereafter a negative resist solution is applied on the main surface of the thin film 11 by a spin coating method and baked. Thus, the rich layer 12a is formed so as to cover the thin film 11.

2-B-b) Forming the Dilute Layer

In this step, the resist solution is applied on the main surface of the rich layer 12a and baked to form the dilute layer 12b in which the photoacid generator concentration is dilute compared to the rich layer 12a. The specific method may be the same as that in the step of forming the rich layer.

However, in this embodiment, when the resist solution, which is the raw material of the dilute layer 12b, is applied on the main surface of the rich layer 12a and baked, mixing (mixture) occurs between the dilute layer 12b (or its raw material) and the rich layer 12a as shown in the example (FIG. 4) described later. As a result, the portion where the mixing occurs becomes the intermediate region 12c.

As described above, the mask blank with resist film 1 of this embodiment is produced. Of course, a washing/drying process, etc., required for producing the mask blank with resist film 1 may be performed as appropriate.

<3. Method for Manufacturing a Transfer Mask>

A method for manufacturing a transfer mask 50 of this embodiment will be described next, using FIG. 3.

3-a) Exposure Step

Next, exposure (electron beam writing) of a predetermined shape is performed on the resist film 12 formed on the mask blank. As a specific exposure method, a publicly-known method may be used.

3-B) Developing Step

Next, a resist pattern 12' is formed by a developing step. For the patterned structure, "'" is given to the reference numerals.

For a developing solution, an aqueous developing solution or an organic solvent developing solution can be used.

As the aqueous developing solution, an aqueous solution of an inorganic alkaline compound such as sodium hydroxide, potassium hydroxide or the like, or an aqueous solution of an organic alkaline substance such as quaternary ammonium hydroxide such as tetramethyl ammonium hydroxide (TMAH) can be given.

As the organic solvent developing solution, esters, ethers, ketones, alcohols, etc., can be given, which can be appropriately selected and used according to the composition of the resist. Examples of specific components include butyl lactate, propylene glycol monomethyl ether acetate (PG-MEA) and propylene glycol monomethyl ether (PGME).

In the developing method using the organic solvent developing solution, a problem such as thinning and undercut are likely to occur at the root of the cross section of the resist pattern due to high permeability of the developing solution, but according to the present invention, since the degree of polymerization of the rich layer 12' (root portion) is high, there is no excessive permeation of the developing solution, and the above-mentioned problem can be effectively suppressed.

3-C) Etching Step

Through the above steps, the resist pattern can be formed. Using the resist pattern 12', a predetermined pattern is formed on the thin film 11 under the resist pattern 12'. The thin film 11 is etched by the developing step using the resist film 12 on which the predetermined resist pattern 12' is formed as a mask. By etching, a predetermined transfer pattern is formed on the thin film 11'.

As a technique of etching, a publicly-known technique may be used. As a preferred example, in the step of etching the thin film 11, dry etching is performed using a reactive gas as an etchant. Use of the resist pattern of this embodiment makes it possible to form a transfer pattern with high accuracy even if an isotropic etching gas is contained in the reactive gas.

It is also appropriate to use an etching method in which chromium is contained in the composition of the surface layer of the thin film 11, while the reactive gas is a mixed gas containing at least oxygen and chlorine.

3-D) Others

Then, the transfer mask 50 of this embodiment is manufactured by removing the resist pattern and appropriately performing other processes such as cleaning. A publicly-known technique may be used as these techniques.

EXAMPLES

Next, the present invention will be described in detail by showing examples. Of course, the present invention is not limited to the following examples. As for matters which are not mentioned in particular, the contents described in JP-A No. 2013-257593 is adopted.

In example 1, the thin film 11 was coated with the solvent rich in the photoacid generator and baked, as the rich layer 12a. At that time, the photoacid generator which is easily dissolved in the negative resist of the dilute layer 12b was selected. Namely, in this situation, it is easy to form the intermediate region 12c.

In example 2, contrary to example 1, the photoacid generator which is not easily dissolved in the negative resist of the dilute layer 12b was selected. Namely, in this situation, it is difficult to form the intermediate region 12c.

In example 3, the rich layer 12a obtained by adding the photoacid generator to the thermosetting resin was used. Namely, the resist underlayer 12a was formed as the rich layer 12a.

Example 1

(Preparation of a Sample)
2-A) Preparing a Substrate with Thin Film (Mask Blank 5)

A light-transmitting substrate 10 (hereinafter also referred to as light-transmitting substrate 10) made of synthetic quartz glass having a main surface dimension of about 152 mm×about 152 mm and a thickness of about 6.25 mm was prepared.

First, the light semi-transmitting film 110 was formed on the light-transmitting substrate 10.

A single wafer type sputtering apparatus was used, and a mixed target (mol % ratio of Mo:Si=10:90) of molybdenum (Mo) and silicon (Si) was used as a sputtering target, and a mixed gas of argon (Ar), nitrogen ($N_2$), and helium (He) (flow ratio Ar:$N_2$:He=5:49:46, pressure=0.3 Pa) was used as a sputtering gas, to thereby form MoSiN film (underlayer) on the substrate 10 made of synthetic quartz glass, with a film thickness of 69 nm, by reactive sputtering (DC sputtering: DC power 3.0 kW).

Subsequently, heat treatment was applied to the substrate 10 on which the MoSiN film was formed, using a heating furnace in the atmosphere at a heating temperature of 450° C. and a heating time of 1 hour. The MoSiN film had a transmittance of 6.16% and a phase difference of 184.4 degrees, obtained by ArF excimer laser.

Next, the light-shielding film 111 having a three-layer structure was formed on the light semi-transmitting film 110.

A single wafer type DC sputtering apparatus was used, a chromium (Cr) target was used, and a mixed gas of argon (Ar), carbon dioxide ($CO_2$), nitrogen ($N_2$) and helium (He) (flow ratio Ar:$CO_2$:$N_2$:He=20:35:10:30, pressure: 0.2 Pa) was used as a sputtering gas, to thereby form CrOCN film (first light-shielding film 111a) with a film thickness of 30 nm, by reactive sputtering (DC sputtering: DC power 1.7 kW).

The same chromium (Cr) target was used, and a mixed gas of argon (Ar) and nitrogen ($N_2$) (flow ratio Ar:$N_2$=25:75, pressure=0.1 Pa) was used as a sputtering gas, to thereby form CrN film (second light-shielding film 111b) on the first light-shielding film 111a, with a film thickness of 4 nm, by reactive sputtering (DC sputtering: DC power 1.7 kW).

The same chromium (Cr) target was used, and a mixed gas of argon (Ar), carbon dioxide ($CO_2$), nitrogen ($N_2$), and helium (He) (flow ratio Ar:$CO_2$:$N_2$:He=20:35:5:30, pressure=0.2 Pa) was used as a sputtering gas, to thereby form a chromium-rich CrOCN film (third light-shielding film 111c) on the second light-shielding film 111b, with a film thickness of 14 nm, by reactive sputtering (DC sputtering: DC power 1.7 kW).

Through the above procedure, the light-shielding film 111 made of a chromium-based material having a three-layer structure of a lowermost layer made of CrOCN, a lower layer made of CrN, and an upper layer made of CrOCN, was formed with a total film thickness of 48 nm from the phase shift film side.

Through the above procedure, the substrate with thin film was obtained. An optical density when the light semi-transmitting film 110 and the light-shielding film 111 were combined, was 3.0 ($\lambda$=193 nm). Further, a surface reflectance of the light-shielding film 111 to the wavelength of the exposure light ($\lambda$=193 nm) was 20%.

2-B) Forming the Resist Film
2-B) Forming the Rich Layer

The surface of the thin film 11 was coated with PGMEA solution by a spin coating method, the PGMEA solution being the solution in which 4-methylphenyl diphenylsulfonium nonafluorobutanesulfonate (photo acid generator) (WPAG-469) manufactured by Wako Pure Chemical Industries, Ltd.) having a melting point of 102° C. to 103° C. is contained by 5% with respect to PGMEA (1-methoxy-2-acetoxypropane), and thereafter baked at 190° C. for 60 seconds to form the rich layer 12a with a thickness of 10 nm. The photoacid generator used in this step is referred to as photoacid generator A.

2-B-b) Forming the Dilute Layer

First, polystyrene resin derivative (photosensitive resin), a crosslinking agent, and diphenyl-2,4,6-trimethylphenylsulfonium p-toluenesulfonate (photoacid generator) (WPAG-467 manufactured by Wako Pure Chemical Industries, Ltd.) were mixed in PGMEA to prepare a resist composition solution. At this time, the mass ratio of the photoacid generator to the photosensitive resin was set to 10:100 as the photo acid generator:photosensitive resin. The surface of the rich layer 12a was coated with the resist composition prepared in this manner by a spin coating method and heated at 130° C. for 600 seconds to form the dilute layer 12b having a thickness of 150 nm. The photoacid generator used in this step is referred to as photoacid generator B.

The mask blank with resist film 1 of this example was prepared using the abovementioned technique.

(Measurement)

Figure 4:
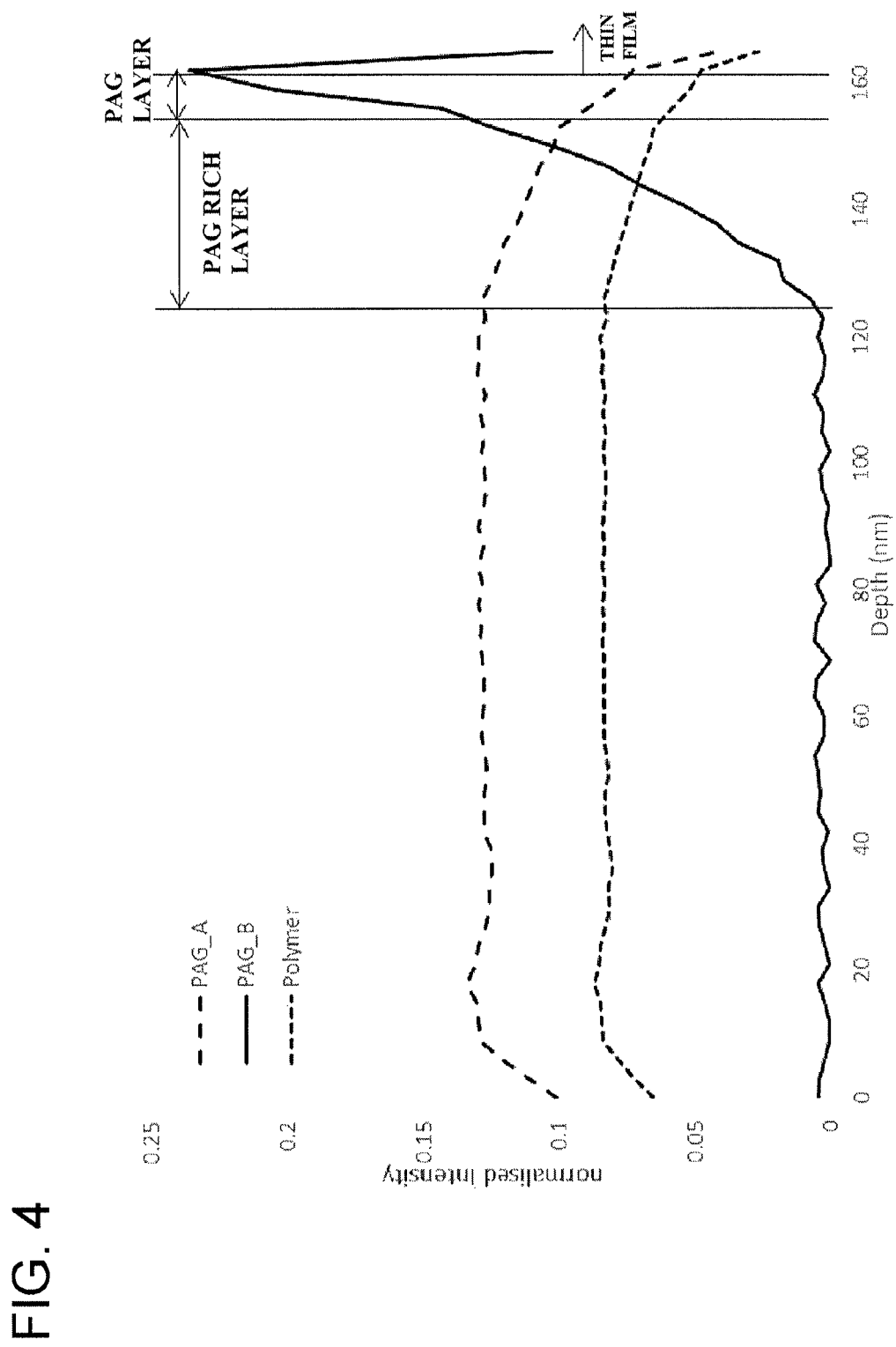
FIG. 4 is a view showing a result of confirming a distribution of a photoacid generator A, a photoacid generator B, and polymer in the mask blank with resist film in a depth direction of the polymer, by TOF-SIMS (time-of-flight secondary ion mass spectrometry), according to example 1.

Distribution of photoacid generator A, photoacid generator B and polymer in the depth direction in the mask blank with resist film 1 was confirmed by TOF-SIMS (time-of-flight secondary ion mass spectrometry). The result is shown in FIG. 4. As shown in FIG. 4, when viewed from the outermost surface of the resist film 12 in the depth direction, there appears a region in which the photo acid generator A and the resist composition for the rich layer 12a (in the figure, the PAG layer, the same applies hereinafter) are compatible with each other in the vicinity of the depth of 125 nm (So-called intermediate region, PAG rich layer in the figure, the same applies hereinafter). Since the base polymer m/z intensity was decreased in the above region, it was confirmed that the concentration of the photoacid generator was higher in that region than in other regions.

(Evaluation)

Thereafter, the pattern was drawn on the resist film 12 using an electron beam drawing apparatus manufactured by Elionix Co., Ltd. For example, the pattern was exposed so that the width of the protrusion (line) of the resist pattern was 200 nm and the ratio of line to space was 1:1, and heat treatment was applied thereto at 130° C. for 600 seconds after drawing. Subsequently development was performed. Development was performed by supplying a developing solution (THAM: tetramethylammonium hydroxide) to the substrate 10 at 5 mL/sec.

Thereafter, drying rotation was performed for 60 seconds at high speed rotation and air drying was performed. The process after removal of the resist pattern was not performed.

Figure 5:
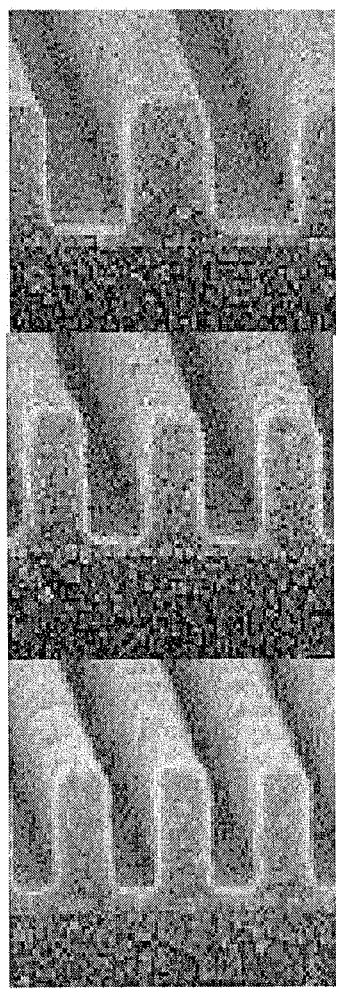
FIG. 5 is an image showing the result of observing an evaluation of a cross-sectional shape of the resist pattern by SEM (scanning electron microscope), according to example 1.

For the sample thus obtained, the cross-sectional shape of the resist pattern was evaluated by SEM. FIG. 5 shows the results. FIG. 5 is an image corresponding to the size of the line & space. Referring to FIG. 5, in the case of this embodiment, the pattern shape can be formed in a shape slightly expanding toward the thin film 11 side, and collapse never occurs even in a pattern with a line width of 60 nm or less.

Example 2

In this example, a sample was prepared in the same manner as in example 1, except that propylene glycol monomethyl ether acetate (PGMEA) was used as the developing solution in the developing step.
(Evaluation)

Figure 6:
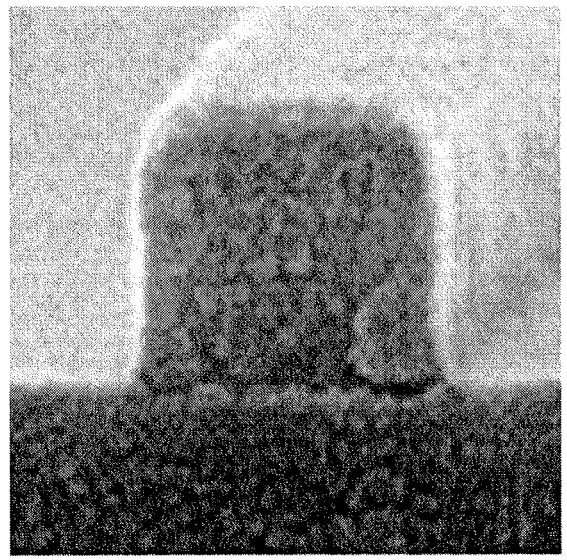
FIG. 6 is an image showing the result of observing the evaluation of the cross-sectional shape of the resist pattern by SEM when a half pitch is 200 nm, according to example 2.

In this example, the sectional shape of the resist pattern with a half pitch of 200 nm was observed by SEM and its shape was evaluated. FIG. 6 is an SEM image thereof. Referring to FIG. 6, it was found that in this example, the pattern shape can be formed so as to be slightly spread toward the thin film 11 side. Even in the case of this example, collapse never occurred even with a pattern in which the line width was 60 nm or less.

Comparative Example 1

In this comparative example, a sample was prepared in the same manner as in example 1, except that the step of forming the rich layer was not performed.
(Evaluation)

Figure 7:
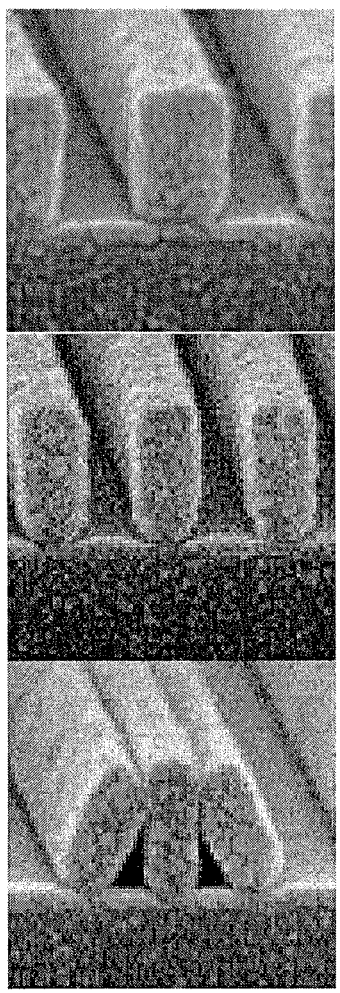
FIG. 7 is an image showing the result of observing the evaluation of the cross-sectional shape of the resist pattern by SEM (scanning electron microscope), according to comparative example 1.

Similarly to example 1, the cross-sectional shape of the resist pattern was evaluated by SEM. FIG. 7 shows the results. FIG. 7 is an SEM image thereof corresponding to the size of the line & space. Referring to FIG. 7, it was found that in the case of this comparative example, excessive thinning and undercut occurred, and when the width of the line was 60 nm or less, collapse of pattern occurred.

Comparative Example 2

In this Comparative Example, a sample was prepared in the same manner as in Example 2, except that the step of forming the rich layer was not performed.
(Evaluation)

Figure 8:
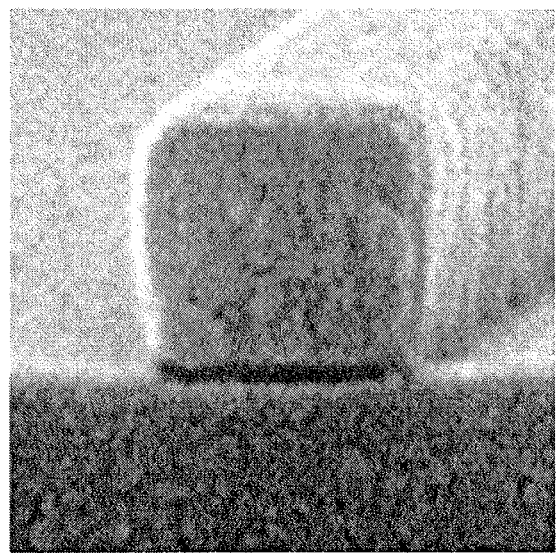
FIG. 8 is an image showing the result of observing the evaluation of the cross-sectional shape of the resist pattern by SEM when the half pitch is 200 nm, according to comparative example 2.

Similarly to example 2, the sectional shape of a resist pattern with a half pitch of 200 nm was observed by SEM and its shape was evaluated. FIG. 8 is an SEM image thereof. FIG. 8 is the SEM image when the half pitch of the resist pattern is 200 nm. Referring to FIG. 8, it was found that in the case of this example, the shape of the pattern was slightly narrowed toward the thin film 11 side. Also, it was found that undercut occurred at the root portion of the resist pattern. Further, in a pattern in which the half pitch was 80 nm or less, collapse occurred.

Example 3

In this example, a sample was prepared in the same manner as in example 1, except that the step of forming a rich layer was performed as follows.

Bis (p-toluenesulfonyl) diazomethane (photoacid generator A') (WPAG-199 manufactured by Wako Pure Chemical Industries, Ltd.) having a melting point of 122° C. was adjusted into a 5 mass % ethyl acetate solution, and the main surface of the thin film 11 was coated with this solution by a spin coating method, and then baked at 190° C. for 60 seconds, to form the rich layer 12a of 5 nm. Subsequently, the same dilute layer 12b as that of example 1 was formed with a thickness of 100 nm.
(Measurement)

Figure 9:
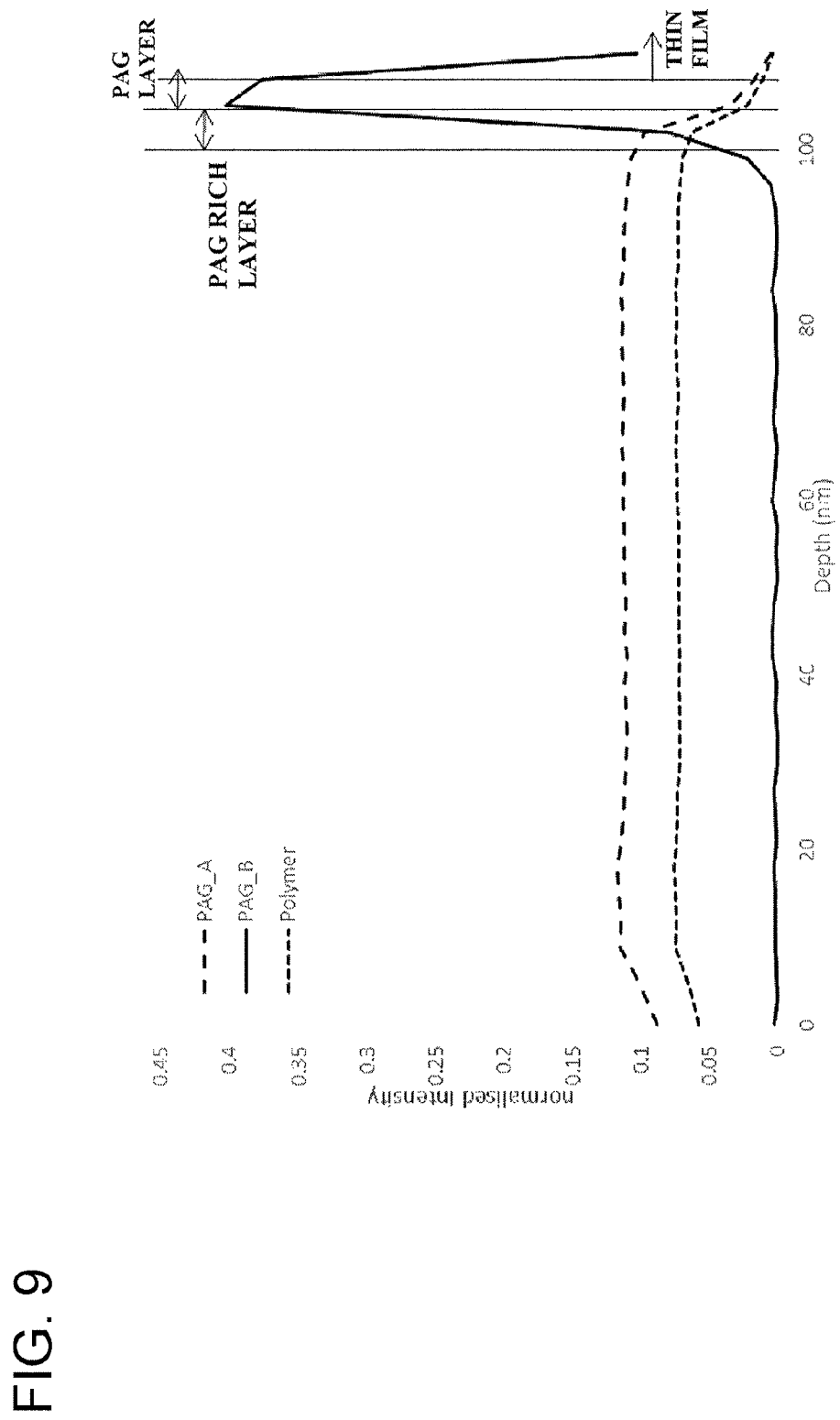
FIG. 9 is a view showing the result of confirming the distribution of a photoacid generator A' and a photoacid generator B, and polymer in the mask blank with resist film by TOF-SIMS, according to example 3.

Distribution of the photoacid generator A', photoacid generator B and polymer in the depth direction in the mask blank with resist film 1 was confirmed by TOF-SIMS. FIG. 9 shows the results. As shown in FIG. 9, when viewed from the outermost surface of the resist film 12 in the depth direction, a region in which the photoacid generator A' and the resist composition in the rich layer 12a were compatible with each other, appeared from the depth of about 90 nm to the depth of 5 nm. It was confirmed that the concentration of the photoacid generator was higher in this region than in the other regions, although the rich layer 12a was further deeper by 5 nm therefrom.
(Evaluation)

Thereafter, in the same manner as in example 1, a pattern was drawn on the resist film 12 and development was performed.

For the sample thus obtained, the cross-sectional shape of the resist pattern was evaluated by SEM. As a result, it was found that in this example, the pattern shape could be formed in a shape slightly expanding toward the thin film 11 side, and collapse never occurred even with a pattern with a line width of 60 nm or less.

Example 4

In this example, a sample was prepared in the same manner as in example 1, except that the step of forming the rich layer was performed as follows.

Using the photoacid generator A (WPAG-469 manufactured by Wako Pure Chemical Industries, Ltd.) used in example 1, a novolac-based polymer (thermosetting resin) as a base polymer and a mixed solvent of PGME and PGMEA as a solvent, were applied to the main surface of the thin film 11 by a spin coating method. The amount of the photoacid generator A was 25 parts by mass based on 100 parts by mass of the base polymer. Thereafter, baking treatment was performed at 190° C. for 60 seconds to form the rich layer 12a (resist underlayer 12a) with a thickness of 30 nm. Subsequently, the same dilute layer 12b as in example 1 was formed with a thickness of 100 nm.
(Measurement)

Figure 10:
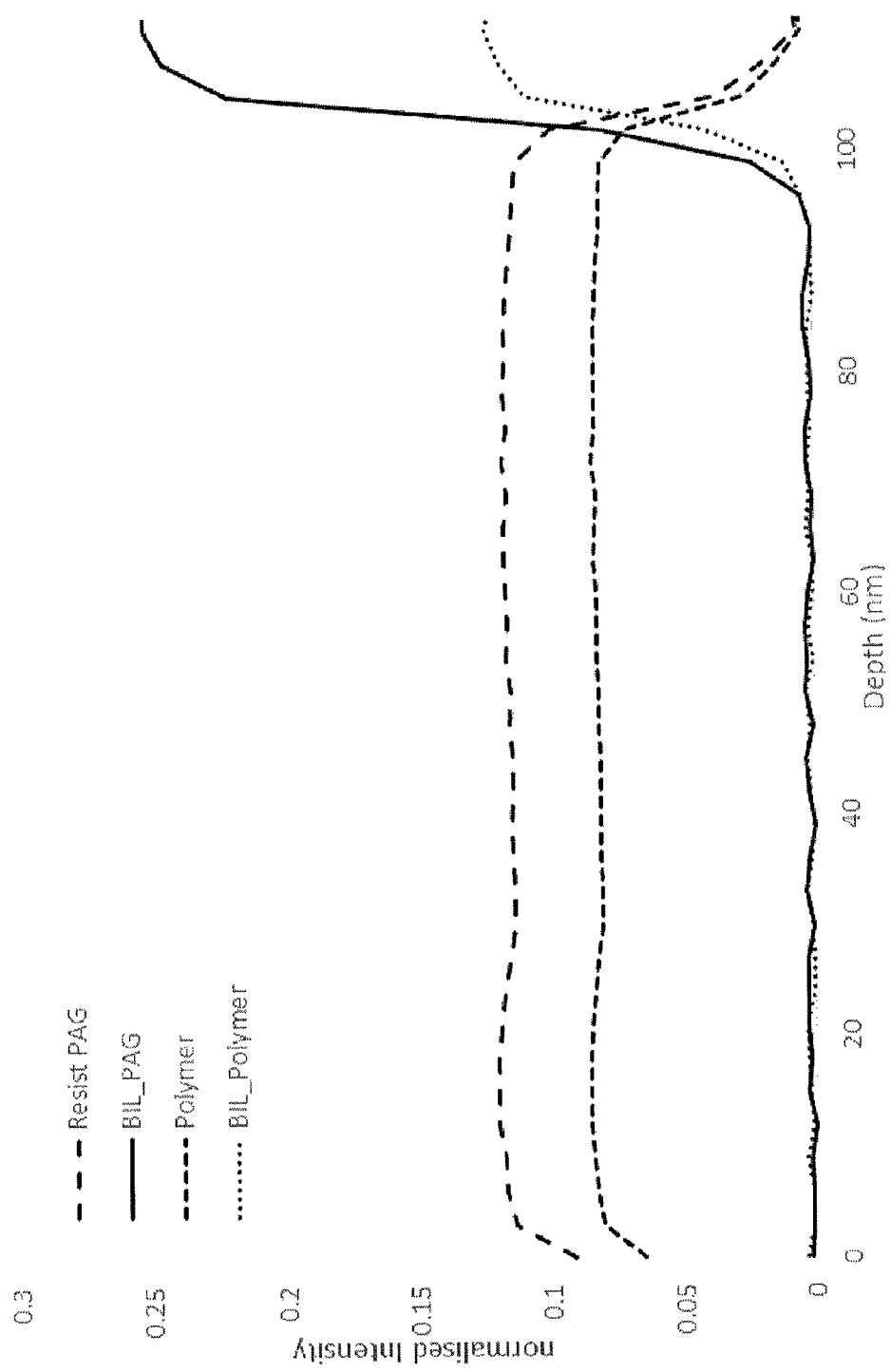
FIG. 10 is a view showing the result of confirming the distribution of the photoacid generator A, photoacid generator B, polymer (thermosetting resin: BIL) of the resist underlayer, and polymer (negative resist) of the dilute layer in the depth direction.

The distribution of the photo acid generator A, the photo acid generator B, the polymer (thermosetting resin: BIL) of the resist underlayer 12a and the polymer (negative resist) of the dilute layer 12b in the depth direction in the mask blank with resist film 1, were measured by TOF-SIMS. FIG. 10 shows the result. As shown in FIG. 10, when viewed in the depth direction from the outermost surface of the resist film 12, it was confirmed that the concentration of the photoacid generator is higher than that in the other regions at a position deeper than 30 nm deep from the depth of 100 nm (that is, the portion of the resist underlayer 12 a). In the main surface side portion of the resist underlayer 12a, a region in which the photoacid generator A and the resist composition were compatible with each other appeared.

(Evaluation)

Thereafter, similarly to example 1, a pattern was drawn on the resist film 12 and development was performed. For the sample thus obtained, the cross-sectional shape of the resist pattern was evaluated by SEM. As a result, it was found that in this example, it was possible to form the pattern shape slightly spreading toward the thin film 11 side, and no collapse occurred even with a pattern with a line width of 60 nm or less.

DESCRIPTION OF SIGNS AND NUMERALS

1 Mask blank with resist film
5 Mask blank
10 Substrate
11 Thin film
110 Light semi-transmitting film
111 Light shielding film
   111a First light shielding film
   111b Second light shielding film
   111c Third light shielding film
12 Resist film
   12a Rich layer (resist underlayer)
   12b Dilute layer
   12c Intermediate region

The invention claimed is:

1. A mask blank with resist film, comprising:
a substrate having a thin film; and
a negative resist film formed on a main surface of the thin film,
wherein a photoacid generator-rich region of the resist film is formed at a portion where the resist film is in contact with the thin film, and a concentration of a photoacid generator in the photoacid generator-rich region is high compared to other region of the resist film,
the photoacid generator-rich region is made of a material having solubility in at least one developing solution selected from an aqueous developing solution and an organic solvent developing solution, and
the other region of the resist film is made of a material having solubility in the same developing solution as the above developing solution.

2. The mask blank with resist film according to claim 1, wherein
the resist film is constituted by a plurality of layers,
a layer among the plurality of layers is in contact with the thin film, and
the layer that is in contact with the thin film is a rich layer, which has a photoacid generator concentration that is higher than that of the other region of the resist film, the rich layer constituting the photoacid generator-rich region of the resist film.

3. The mask blank with resist film according to claim 2, wherein the resist film further comprises:

a dilute layer among the plurality of layers, the dilute layer being a layer on an outermost surface side of the resist film viewed from the rich layer, wherein the dilute layer has a photoacid generator concentration that is lower than that of the rich layer;
and
an intermediate region that formed between the dilute layer and the rich layer, the intermediate region having a photoacid generator concentration between the photoacid generator concentration of the dilute layer and the photoacid generator concentration of the rich layer.

4. The mask blank with resist film according to claim 2, wherein the photoacid generator in the rich layer does not contain trifluoromethyl.

5. The mask blank with resist film according to claim 1, wherein
the aqueous developing solution is an aqueous solution of an inorganic alkaline compound or an aqueous solution of an organic alkaline substance.

6. The mask blank with resist film according to claim 1, wherein
the organic solvent developing solution is one selected from esters, ethers, ketones, and alcohols.

7. The mask blank with resist film according to claim 1, wherein
the photoacid generator comprises a first photoacid generator and a second photoacid generator,
the resist film is constituted by a single layer,
the first photoacid generator in the photoacid generator-rich region has no polarity, and
the second photoacid generator in the other region of the resist film has polarity.

8. The mask blank with resist film according to claim 1, wherein
the photoacid generator-rich region contains a thermosetting resin.

9. A method for manufacturing a mask blank with resist film, comprising the steps of:
preparing a substrate having a thin film; and
forming a negative resist film on a main surface of the thin film,
wherein the step of forming a resist film further includes the steps of:
forming a rich layer in which a photoacid generator is rich, by coating the main surface of the thin film with a photoacid generator-rich solution and baking it; and
forming a dilute layer in which the photoacid generator is dilute compared to the rich layer, by coating a main surface of the rich layer with a resist solution and baking it to obtain a mask blank with resist film of claim 1, which comprises:
the substrate having a thin film; and
the negative resist film formed on the main surface of the thin film,
wherein the rich layer is a photoacid generator-rich region of the resist film and is formed at a portion where the resist film is in contact with the thin film, and a concentration of a photoacid generator in the photoacid generator-rich region is high compared to other region of the resist film in which the photoacid generator is dilute compared to the rich layer,
the photoacid generator-rich region is made of a material having solubility in at least one developing solution selected from an aqueous developing solution and an organic solvent developing solution, and the other region of the resist film is made of a material having solubility in the same developing solution as the above developing solution.

10. The method for manufacturing a mask blank with resist film according to claim 9, wherein the photoacid generator contained in a solution used in the step of forming a rich layer does not contain trifluoromethyl.

11. A method for manufacturing a transfer mask, comprising the step of:
    forming an uneven pattern on at least a thin film out of a mask blank by using the mask blank with resist film of claim 1.

12. A method for manufacturing a transfer mask using the mask blank with resist film of claim 1, comprising the step of:
    forming a pattern on the resist film,
    wherein the step of forming the resist pattern further comprises the steps of:
    electron beam drawing of the resist film; and
    developing the resist film,
    wherein the developing solution used in the developing step is an organic solvent developing solution.

\* \* \* \* \*